United States Patent
Tosaka

(10) Patent No.: US 7,026,858 B2
(45) Date of Patent: Apr. 11, 2006

(54) SWITCH SEMICONDUCTOR INTEGRATED CIRCUIT

(75) Inventor: Hiroyuki Tosaka, Kamifukuoka (JP)

(73) Assignee: New Japan Radio Co., Ltd., Tokyo (JP)

( * ) Notice: Subject to any disclaimer, the term of this patent is extended or adjusted under 35 U.S.C. 154(b) by 105 days.

(21) Appl. No.: 10/390,777

(22) Filed: Mar. 19, 2003

(65) Prior Publication Data

US 2004/0077150 A1 Apr. 22, 2004

(30) Foreign Application Priority Data

Oct. 21, 2002 (JP) ............................. 2002-306046

(51) Int. Cl.
*H03K 17/687* (2006.01)

(52) U.S. Cl. ...................... 327/427; 327/308

(58) Field of Classification Search ............... 327/374, 327/379, 427, 430–431, 308; 333/101, 17.3, 333/81 A, 81 R; 326/30; 307/112–113, 307/116, 125, 129–130
See application file for complete search history.

(56) References Cited

U.S. PATENT DOCUMENTS

| | | | | | |
|---|---|---|---|---|---|
| 5,563,545 A | * | 10/1996 | Scheinberg | ............... | 327/389 |
| 5,633,610 A | * | 5/1997 | Maekawa et al. | ........... | 327/355 |
| 5,767,721 A | * | 6/1998 | Crampton | .................. | 327/308 |
| 5,945,867 A | * | 8/1999 | Uda et al. | ................... | 327/431 |
| 5,990,580 A | * | 11/1999 | Weigand | .................... | 307/125 |
| 6,201,455 B1 | * | 3/2001 | Kusunoki | ................... | 333/103 |
| 6,229,370 B1 | * | 5/2001 | Inamori et al. | ............. | 327/308 |

\* cited by examiner

*Primary Examiner*—My-Trang Nu Ton
(74) *Attorney, Agent, or Firm*—Armstrong, Kratz, Quintos, Hanson & Brooks, LLP

(57) ABSTRACT

A switch semiconductor integrated circuit having a switch FET for controlling passage of a high-frequency signal so that the switch FET is switched between on-operation and off-operation. The switch semiconductor integrated circuit includes a logic control section using of an inverter circuit which generates the switching signal in accordance with a control signal applied from outside. The inverter circuit uses a junction-type FET in which the gate of the switch FET is connected to an output end of the inverter circuit via a gate resistor, and the output end is connected to a coupling capacitor which couples a part of the high-frequency signal. The coupled high-frequency signal is rectified by an equivalent diode between the gate and drain of the junction-type FET, and is superposed onto a DC voltage applied to the gate of the switch FET.

3 Claims, 7 Drawing Sheets

SWITCH SEMICONDUCTOR INTEGRATED CIRCUIT

BACKGROUND OF THE INVENTION

1. Field of the Invention

The present invention relates to a switch semiconductor circuit which performs switching of high-frequency signals, particularly to a switch semiconductor circuit with improved operation characteristics.

2. Description of the Related Art

In portable telephones, mobile wireless communication devices and the like which deal with high-frequency signals, there is used a switch semiconductor integrated circuit which makes use of a MESFET (Metal Semiconductor Field Effect Transistor) which is a field effect transistor made of a GaAs compound semiconductor, an HEMT (High Electron Mobility Transistor) or the like for performing switching of the high-frequency signals.

Because such a portable terminal apparatus of mobile wireless is driven by a battery, there is a need for a switch semiconductor integrated circuit capable of switching the high-frequency signals particularly at a low voltage. As such a switch semiconductor integrated circuit, an SPDT (Single Pole Dual Throw) switch circuit, for example, is publicly and widely known which is designed to include an inverter circuit for performing switching with one control signal (see, for example, Japanese Unexamined Patent Publication No. 164772/2002, p. 4, FIG. 1).

FIG. 7 shows one example of such a conventional SPDT switch circuit. Hereafter, this conventional circuit will be described with reference to FIG. 7.

Referring to FIG. 7, P1, P2, and P3 denote signal terminals; Q1, Q2, Q3, Q4, and Q5 denote FETs; S1 denotes a control bias application terminal; R1, R2, R3, R4, R5, and R6 denote resistors; C1, C2, and C3 denote depletion capacitors for shutting off a DC current; and V1 denotes a power source for supplying a driving voltage Vdd.

The inverter circuit in the exemplified circuit of FIG. 7 is a generally well-known DCFL (Direct Coupling FET Logic), where FETs of enhancement type are used as Q3, Q4, and Q5 constituting the inverter circuit, and FETs of depletion type are usually used as Q1 and Q2 for switching for the purpose of reducing the passage loss at the time of on-state.

In such an arrangement, when a high level voltage is applied to, for example, control bias application terminal S1, FET Q3 is turned into an on-state, whereby the gate of switch FET Q1 is set at the GND voltage. Also, because the other FET Q4 connected to control bias application terminal S1 is turned into the on-state, the gate of FET Q5 is set at the GND voltage as well. In result, FET Q5 of enhancement type is brought into an off-state, whereby power source voltage Vdd is applied from power source V1 to the gate of switch FET Q2 via load resistor R6. Further, the drain and source of switch FETs Q1, Q2 are set at the power source voltage Vdd via resistor R3.

Because such a voltage is supplied to the switch circuit, the voltage differences between the gate and drain and between the gate and source of switch FET Q2 will be zero, thereby making the drain and source of switch FET Q2 electrically connected with each other. On the other hand, power source voltage Vdd is applied between the gate and drain and between the gate and source of switch FET Q1 in a reverse direction in a Schottky junction, thereby making the drain and source of switch FET Q1 electrically non-conductive with each other. In result, signal terminal P1 and signal terminal P3 are electrically connected to enable passage of high-frequency signals, whereas signal terminal P1 and signal terminal P2 are electrically separated with each other.

On the other hand, when a voltage of low level is applied to control bias application terminal S1, the gate voltage of switch FET Q1 is set at Vdd, and the gate voltage of switch FET Q2 is set at GND voltage, whereby signal terminal P1 and signal terminal P2 are electrically connected with each other to enable passage of high-frequency signals, whereas signal terminal P1 and signal terminal P3 are electrically separated from each other, in contrast to the aforementioned case in which the high level voltage is applied to control bias application terminal S1.

In such a switch semiconductor integrated circuit, the maximum power that the switch semiconductor integrated circuit can handle is determined usually by the FET in the off-state. For example, it is publicly and widely known that the maximum power Pmax of high-frequency signals is given generally by the following formula (see, for example, "Monolithic Microwave Integrated Circuit (MMIC)", Masayoshi AIKAWA and four others, Electronic Information Communication Society (a corporate juridical person), Jan. 25, 1997).

$$P\text{max} = 2\{n(V\text{bias} - V\text{p})\}^2 / Z_0$$

Here, n denotes the number of switch FETs connected in series; Vp denotes the pinch-off voltage of the switch FET; Vbias denotes the bias voltage applied to the gate terminal of the switch FET of off-state; and $Z_0$ denotes the characteristic impedance of the system. According to this formula, it will be understood that, in order to increase the maximum power Pmax in a switch semiconductor integrated circuit, the number of switch FETs connected in series might be increased, or the pinch-off voltage of the switch FET might be made shallow, or further the bias voltage might be raised.

However, a conventional switch semiconductor integrated circuit described above, which is used in a portable terminal apparatus, raises a problem in that the increase of the number of switch FETs invites an increase in the chip area, leading an increase in cost. Further, if the pinch-off voltage of the switch FET is made shallow, the increase of on-resistance of the switch FET is invited, thereby raising the problem of degradation of passage loss, which is one of the most important characteristics when the switch FET is turned into an on-state. Further, in a switch semiconductor integrated circuit used in a portable terminal apparatus, there is a problem in that the bias voltage of the switch FET cannot be simply raised as a result of the aforementioned demand for driving at a low voltage.

Therefore, as a means for increasing the bias voltage of an FET, there is proposed, for example, a technique as disclosed in Japanese Unexamined Patent Publication No. 112314/1999. Namely, according to this method, a DC voltage is generated from a high-frequency signal with the use of a DC voltage generating circuit composed of diodes, resistors, and capacitors, and a switch control voltage is generated from the higher one of the driving voltage and the DC voltage in accordance with the timing of switching the high-frequency signal, so as to raise the bias voltage.

However, according to this technique, the complex arrangement of the circuit raises the problem of inviting the increase of chip area and the cost increase due to increase in the number of components.

SUMMARY OF THE INVENTION

The present invention has been made in view of the above circumstances, and an object thereof is to provide a switch semiconductor integrated circuit which is driven at a low voltage and can perform switching of high-frequency signals of larger power than in conventional cases.

Another object of the present invention is to provide a switch semiconductor integrated circuit which can improve high-frequency characteristics and deformation characteristics.

In accordance with the present invention, there is provided a switch semiconductor integrated circuit having a switch FET for controlling passage of a high-frequency signal so that the switch FET is switched between on-operation and off-operation by a switching signal applied to a gate of the switch FET, wherein the switch semiconductor integrated circuit includes a logic control section using of an inverter circuit which generates the switching signal in accordance with a control signal applied from outside, the inverter circuit uses a junction-type FET to which a resistance load connected to a power source is connected, and the gate of the switch FET is connected to an output end of the inverter circuit via a gate resistor, and the output end is connected to a coupling capacitor which couples a part of the high-frequency signal, whereby the coupled high-frequency signal is rectified by an equivalent diode between the gate and drain of the junction-type FET, and is superposed onto a DC voltage applied to the gate of the switch FET.

With this arrangement, when the junction-type FET of the inverter circuit is turned into an off-state, the switch FET is turned into an on-state and, at that time, a part of the high-frequency signal coupled by the coupling capacitor is rectified by the diode equivalently existing between the gate and drain of the junction-type FET in the off-state, and is superposed onto the DC voltage applied to the gate of the switch FET, thereby enabling switching of high-frequency signals of a larger power than in conventional cases, even at a low driving voltage.

DETAILED DESCRIPTION

Hereafter, embodiments of the present invention will be described with reference to FIGS. 1 to 6.

Here, it is to be noted that the materials, arrangements, and others described below in no way limit the present invention, so that various modifications can be made as long as they remain within the scope of the present invention.

First, a first exemplified circuit according to an embodiment of the present invention will be described with reference to FIG. 1.

The switch semiconductor integrated circuit SC1 in this first exemplified circuit is constituted to be roughly divided into a switch section 101 and a logic control section 102.

Switch section 101 includes first and second switch FETs 1, 2 (represented respectively as "Q1" and "Q2" in FIG. 1), where the operations of the first and second switch FETs 1, 2 are, as described later, switched by a switching voltage from logic control section 102, whereby the connection states between the first to third signal terminals 41, 42, 43 (represented respectively as "P1", "P2", "P3" in FIG. 1) are changed (the details will be described later).

Logic control section 102 outputs a switch control signal for controlling the operations of the first and second switch FETs 1, 2 of switch section 101 in accordance with a control signal applied to a control signal input terminal 45 (represented as "S1" in FIG. 1) from outside (the details will be described later).

Hereafter, a specific circuit constitution will be described.

First, switch section 101 includes the first and second switch FETs 1, 2 as major constituent elements and, in the embodiments of the present invention, both are composed of depletion-type field effect transistors.

Figure 1:
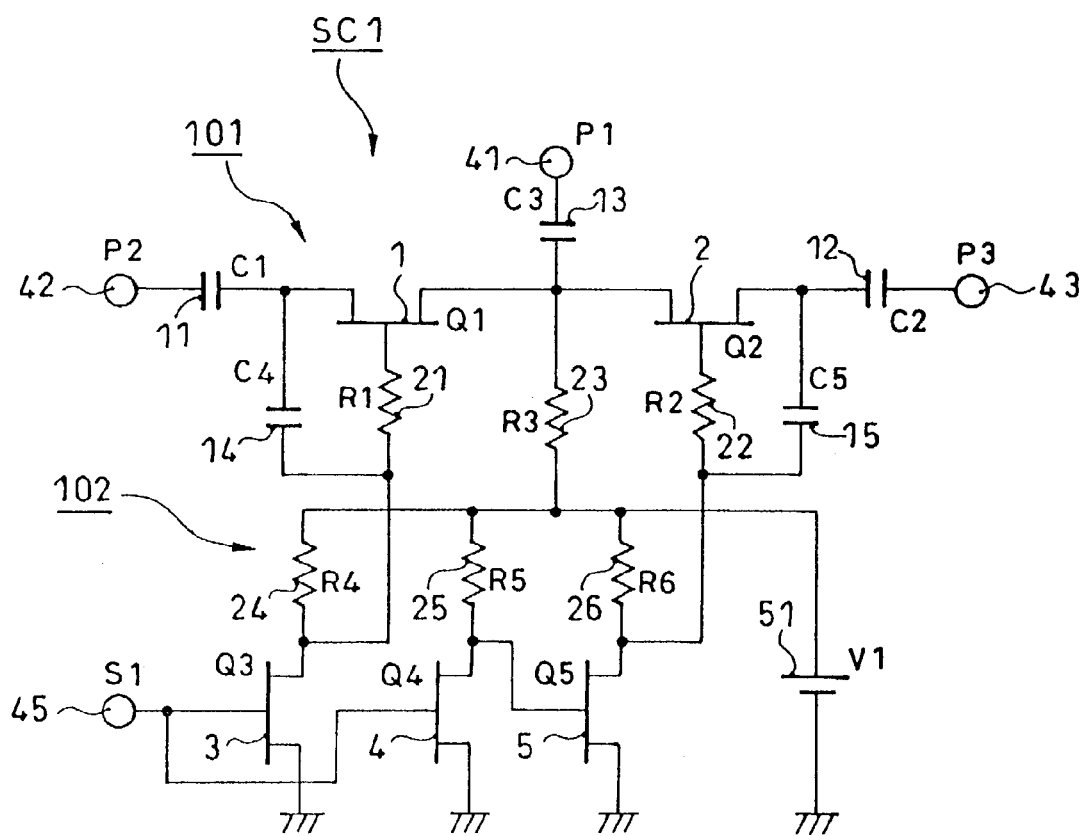
FIG. 1 is a circuit diagram illustrating a first exemplified circuit of a switch semiconductor integrated circuit according to an embodiment of the present invention.

The drain (or source) of the first switch FET 1 is connected to a second signal terminal 42 via first capacitor 11 (represented as "C1" in FIG. 1), whereas the source (or drain) of the first switch FET 1 and the drain (or source) of the second switch FET2 together are connected to a first signal terminal 41 via a third capacitor 13 (represented as "C3" in FIG. 1). Further, the source (or drain) of the first switch FET 1 and the drain (or source) of the second switch FET 2 together are connected to power source 51 (represented as "V1" in FIG. 1) via a third resistor 23 (represented as "R3" in FIG. 1).

Furthermore, the source (or drain) of the second switch FET 2 is connected to a third signal terminal 43 via a second capacitor 12 (represented as "C2" in FIG. 1).

Also, the gate of the first switch FET 1 is connected to the drain (or source) of a third FET 3 (represented as "Q3" in FIG. 1), which is one of the constituent elements of the later-described logic control section 102, via a first resistor 21 (represented as "R1" in FIG. 1), whereas the gate of the second switch FET 2 is connected to the drain (or source) of a fifth FET 5 (represented as "Q5" in FIG. 1), which is also one of the constituent elements of the later-described logic control section 102, via a second resistor 22 (represented as "R2" in FIG. 1).

Further, the drain of the first switch FET 1 is connected to the drain of the third FET 3 via a fourth capacitor 14 (represented as "C4" in FIG. 1), and the drain of the second switch FET 2 is connected to the drain of the fifth FET 5 via a fifth capacitor 15 (represented as "C5" in FIG. 1).

On the other hand, logic control section 102 includes third to fifth FETs 3 to 5 as major constituent elements and, in the embodiments of the present invention, they are composed of enhancement-type field effect transistors, each constituting a resistance load inverter circuit.

Specifically, first, the gates of the third and fourth FETs 3, 4 are connected to control signal input terminal 45. Further, the sources (or drains) of the third and fourth FETs 3, 4 are both connected to the ground, whereas the drain (or source) of the third FET 3, which is in other words the output end of the inverter circuit, is connected to power source 51 via a fourth resistor 24 (represented as "R4" in FIG. 1). Furthermore, the drain (or source) of a fourth FET 4 (represented as "Q4" in FIG. 1) is connected to power source 51 via a fifth resistor 25 (represented as "R5" in FIG. 1).

Also, the gate of the fifth FET 5 is connected to the drain (or source) of the fourth FET 4. Further, the drain (or source) of the fifth FET 5, which is in other words the output end of the inverter circuit, is connected to power source 51 via a sixth resistor 26 (represented as "R6" in FIG. 1), whereas the source (or drain) of the fifth FET 5 is connected to the ground.

Here, in the embodiments of the present invention, in the arrangement described above, the line from the drain of the third FET 3 to the connection point between the first resistor 21 and fourth capacitor 14 and the line from the drain of the fifth FET 5 to the connection point between the second resistor 22 and fifth capacitor 15 will be both referred to as "switching signal line" for the sake of convenience.

Next, the operation in the aforesaid arrangement will be described.

First, a description will be provided regarding the operation when a voltage of a level corresponding to the logic value of high is applied to control signal input terminal 45. In this case, this voltage application turns the third and fourth FETs 3, 4 into an on-state (electrically conducted state).

Because the third FET 3 is turned on, the gate of the first switch FET 1 is set approximately at the ground voltage. For this reason, the first switch FET 1 is turned into an off-state (electrically non-conductive state).

On the other hand, because the fourth FET 4 is in the on-state, the fifth FET 5 is turned into the off-state (electrically non-conductive state), so that approximately the power source voltage Vdd is applied to the gate of the second switch FET 2 via the sixth resistor 26 and second resistor 22, thereby turning the second switch FET 2 into the on-state.

As a result, passage of a high-frequency signal is enabled between the first signal terminal 41 and third signal terminal 43, whereas passage of the high-frequency signal is shut off between the first signal terminal 41 and second signal terminal 42 as a result of the off-state of first switch FET 1. Here, a part of the high-frequency signal applied to the first signal terminal 41 or third signal terminal 43 leaks to the switching signal line via the fifth capacitor 15 for coupling.

Here, because a resistance value from ten KΩ to several ten KΩ is usually selected for the fourth to sixth resistors 24 to 26 constituting the inverter load resistances for reduction of electric current consumption, the switching signal line will have a large impedance. For this reason, the high-frequency signal which has leaked to the switching signal line via the fifth capacitor 15 is superposed onto power source voltage Vdd, which is a DC voltage.

Further, because the fifth FET 5 has a junction-type gate structure, the part between the gate and drain thereof is in a state equivalent to that in which a diode, which is equivalently brought into a reverse bias state by the high-frequency signal that has leaked via the fifth capacitor 15, is present. For this reason, if the high-frequency signal is in a period of positive value, the voltage of the switching signal line will rise as long as the voltage remains within the reverse-direction breakdown voltage of the aforesaid virtual diode.

On the other hand, if the high-frequency signal is in a period of negative value, the diode will be in the on-state, namely, the gate and drain of the fifth FET 5 will be electrically connected with each other when the voltage value of the sum of the power source voltage Vdd and the high-frequency signal superposed onto this power source voltage Vdd exceeds the built-in voltage Vbi of the virtual diode. Then, because the fourth FET 4 connected to the gate of the fifth FET 5 is in the on-state, the gate of the fifth FET 5 will be approximately equal to the ground voltage, whereby the voltage of the switching signal line will be fixed to −Vbi.

Figure 4:
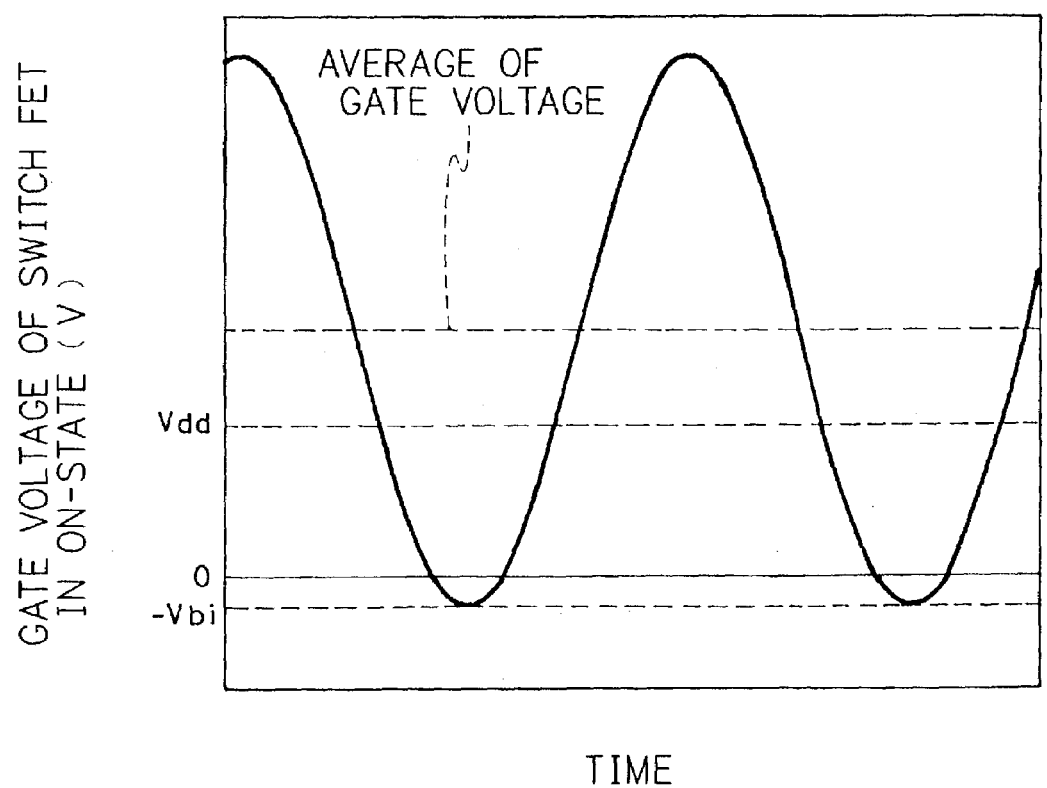
FIG. 4 is a characteristic diagram showing change in the gate voltage of a switch FET in an on-state in a switch semiconductor integrated circuit according to an embodiment of the present invention.

As a result, a rectified voltage waveform shown in FIG. 4 will appear on the switching signal line connected to the gate of the second switch FET 2 which is in the on-state. The DC voltage component of this rectified voltage is, as will be naturally understood from FIG. 4, in a state of being higher than the power source voltage Vdd. Therefore, a DC voltage higher than the power source voltage Vdd will be applied to the gate of the switch FET in the on-state, namely the second switch FET 2 in this case.

For this reason, the gate voltage of the second switch FET 2 in the on-state will be higher than Vdd which is the drain/source voltage, and if the voltage difference from this Vdd exceeds the built-in voltage Vbi of the diodes equivalently present between the gate and drain and between the gate and source of the switch FET in the on-state, the equivalent diodes will be brought into the on-state. Therefore, the voltage obtained by subtracting the built-in voltage Vbi from the voltage applied to the gate of the second switch FET 2 in the on-state will appear at the drain and source of the second switch FET 2.

On the other hand, at this moment, because the drain voltage and the source voltage of the first switch FET 1 in the off-state have the same voltage as the second switch FET 2 in the on-state, the drain voltage and the source voltage of the first switch FET 1 in the off-state will also rise from the power source voltage Vdd.

Further, the gate voltage of the first switch FET 1 in the off-state is fixed at the ground voltage, as described before. For this reason, although the reverse-direction bias voltage applied between the gate and drain and between the gate and source of the first FET 1 in the off-state is usually the power source voltage Vdd, one can apply a bias voltage higher than Vdd due to the above-described operation in the case of the switch semiconductor integrated circuit according to the embodiments of the present invention. In result, the maximum power that the FET in the off-state, namely the first switch FET 1 in this case, can handle increases, thereby enabling switching of a larger signal in the switch semiconductor integrated circuit as a whole.

This will be more conspicuous as the input power becomes larger, so that without increasing the power source voltage, the system will be in a state equivalent to that in which the power source voltage is raised when a larger signal is input, thereby providing a switch semiconductor integrated circuit which can switch a high-frequency signal of a large power even at a low driving voltage.

Figure 5:
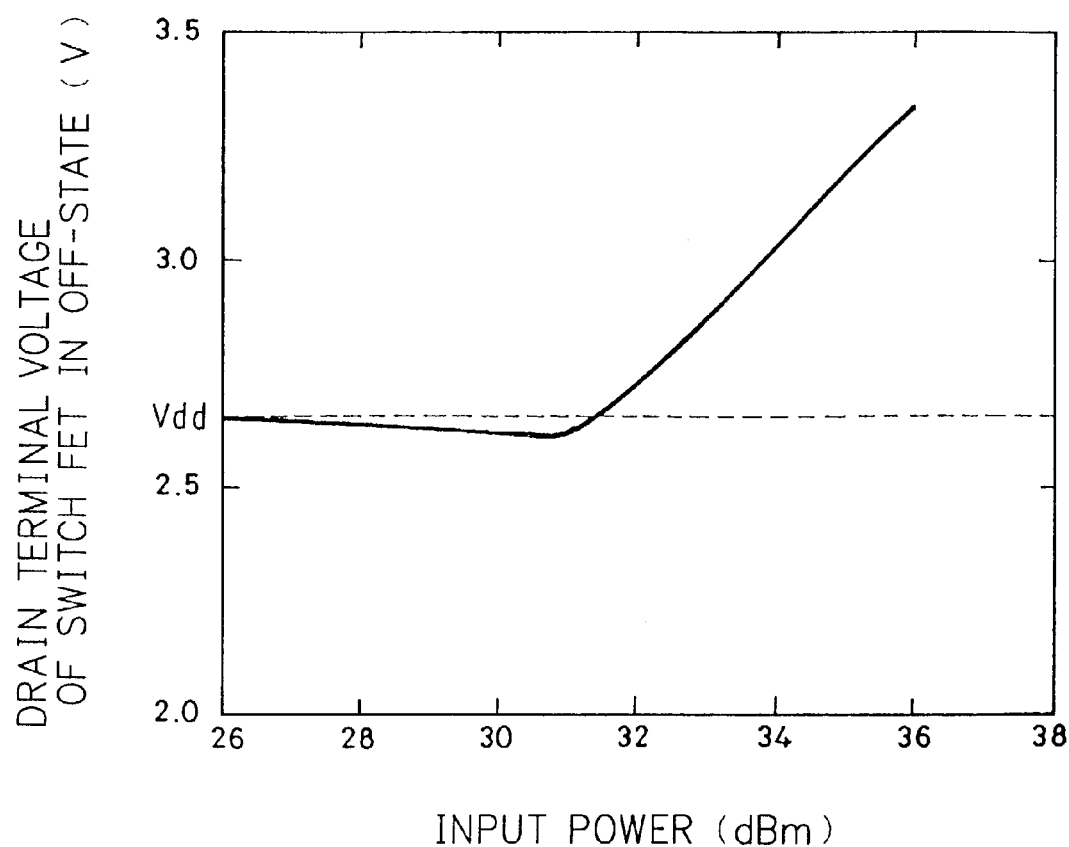
FIG. 5 is a characteristic diagram showing change in the drain voltage relative to change in the input power of a switch FET in an off-state in a switch semiconductor integrated circuit according to an embodiment of the present invention.

FIG. 5 shows a measurement example of the drain/source terminal voltage of the switch FET in the off-state in a switch semiconductor integrated circuit according to the present invention. Hereafter, FIG. 5 will be described. First, in FIG.

5, the axis of abscissa represents the input power, and the axis of ordinate represents the drain (or source) terminal voltage respectively.

First, in a conventional circuit, the drain terminal voltage maintains the constant value of Vdd irrespective of the change in the input power. On the other hand, one can confirm from FIG. 5 that, in the switch semiconductor integrated circuit according to the present invention, the voltage appearing at the drain terminal is the power source voltage in a range in which the input power is small; however, when the input power increases further, the DC voltage appearing at the drain terminal begins to rise at about 30 dBm and when the input power is further increased, the drain terminal voltage will rise as the input power increases.

Figure 6:
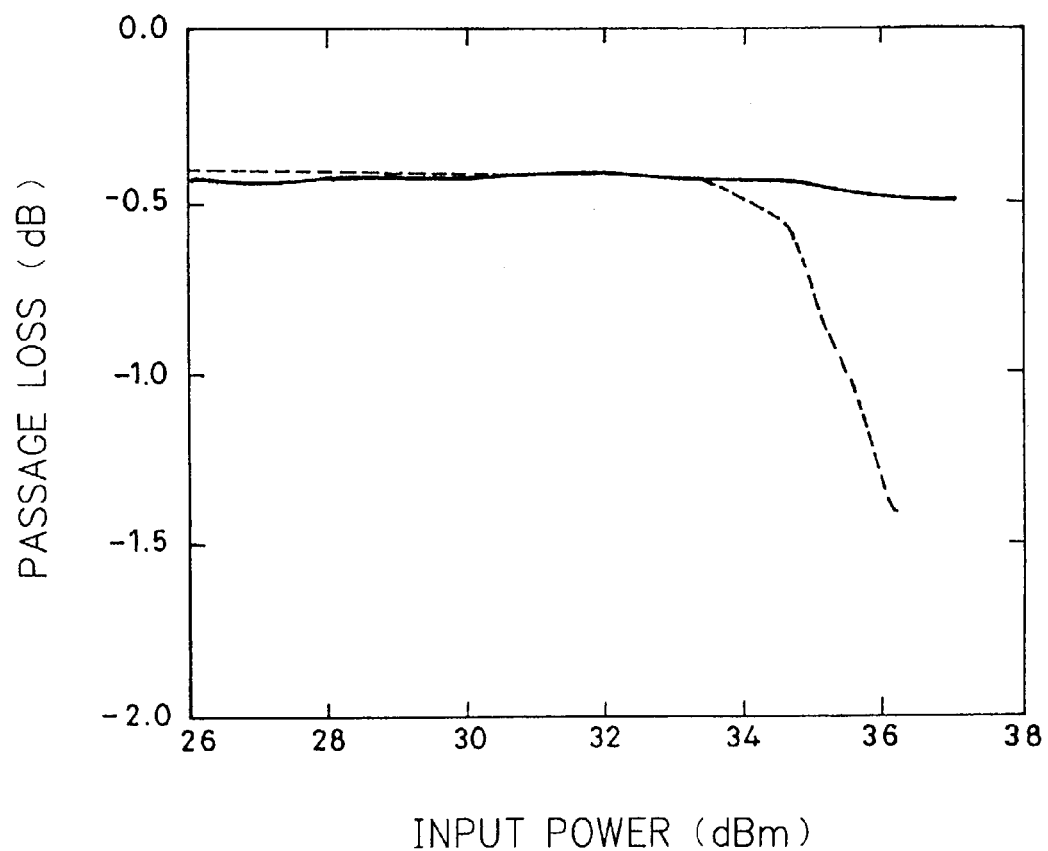
FIG. 6 is a characteristic diagram showing change in the passage loss relative to the input power in a switch semiconductor integrated circuit according to an embodiment of the present invention and in a conventional circuit.
Figure 7:
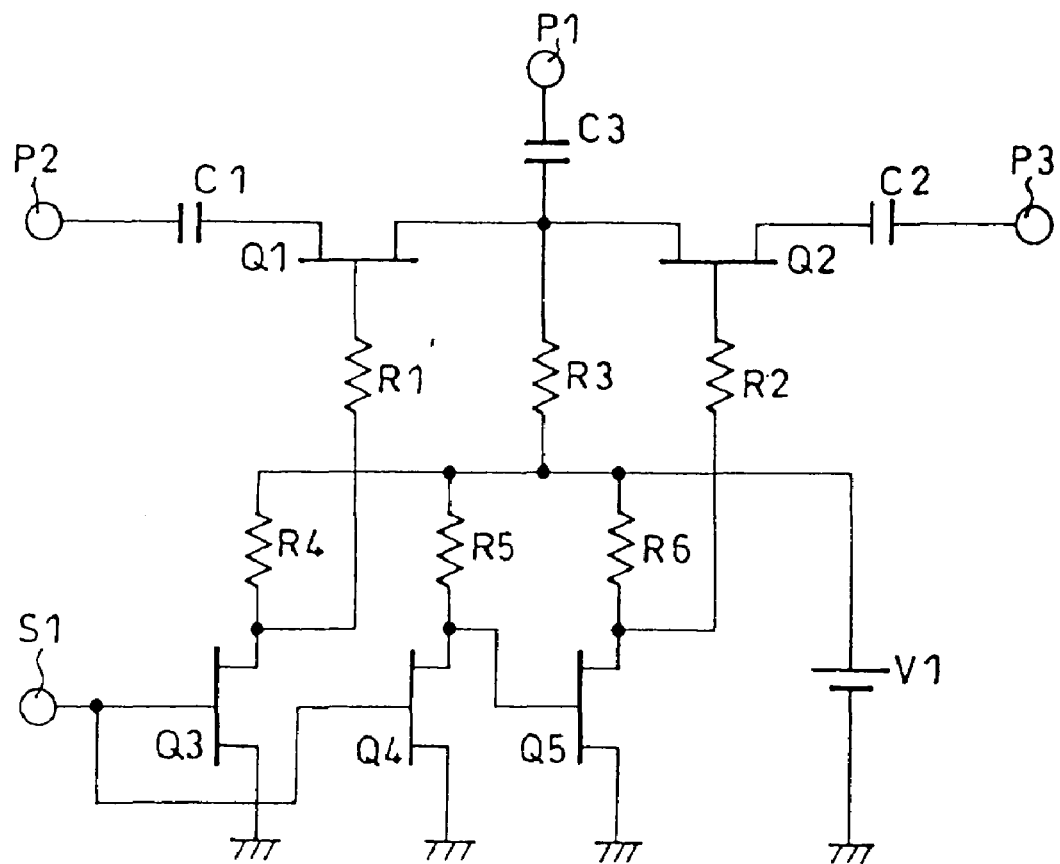
FIG. 7 is a circuit diagram illustrating one exemplified circuit of a conventional circuit.

Next, FIG. 6 shows a measurement example of the passage loss relative to the input power in a switch semiconductor integrated circuit according to the present invention. Hereafter, FIG. 6 will be described. First, in FIG. 6, the axis of abscissa represents the input power, and the axis of ordinate represents the passage loss. Further, in FIG. 6, the dotted line represents a measurement example of a conventional circuit, while the solid line represents a measurement example of the switch semiconductor integrated circuit according to the present invention.

Here, the conventional circuit is under the same condition as the circuit of the present invention with respect to the number of connected FETs in use, the pinch-off voltage of the FETs, and the power source voltage except that the capacitors corresponding to the fourth and fifth capacitors 14, 15 in the example of FIG. 1 are absent.

One can confirm from this measurement example that, in the case of the conventional circuit, the passage loss begins to deteriorate when the input power becomes about 33 dBm, and thereafter, the passage loss will increase exponentially as the input power increases (see the characteristic line shown in a dotted line of FIG. 6).

In contrast, one can confirm that, in the case of the switch semiconductor integrated circuit according to the present invention, no deterioration of the passage loss occurs even if the input power increases, despite the same operation voltage as in the conventional circuit (see the characteristic line shown in a solid line of FIG. 6).

Thus, in the case of the switch semiconductor integrated circuit according to the present invention, the power switching capability, which is one of the important operation characteristics, can be greatly improved without raising the power source voltage. Further, it is usually sufficient that the capacitors used for coupling a high-frequency signal, which correspond to the fourth and fifth capacitors 14, 15 shown in FIG. 1, have a tiny capacitance of 1 pF or lower, so that the above-described operation characteristics can be obtained without increasing the scale or chip size of the integrated circuit.

Here, the input power at which the gate voltage begins to rise can be adjusted by the values of the fourth and fifth capacitors 14, 15 for coupling with the high-frequency signal line. Further, in the example shown in FIG. 1, one end of the fourth capacitor 14 is connected to the second signal terminal 42 side, and one end of the fifth capacitor 15 is connected to the third signal terminal 43 side; however, similar functions and operations can be obtained even if they are connected to the first signal terminal 41 side.

Figure 2:
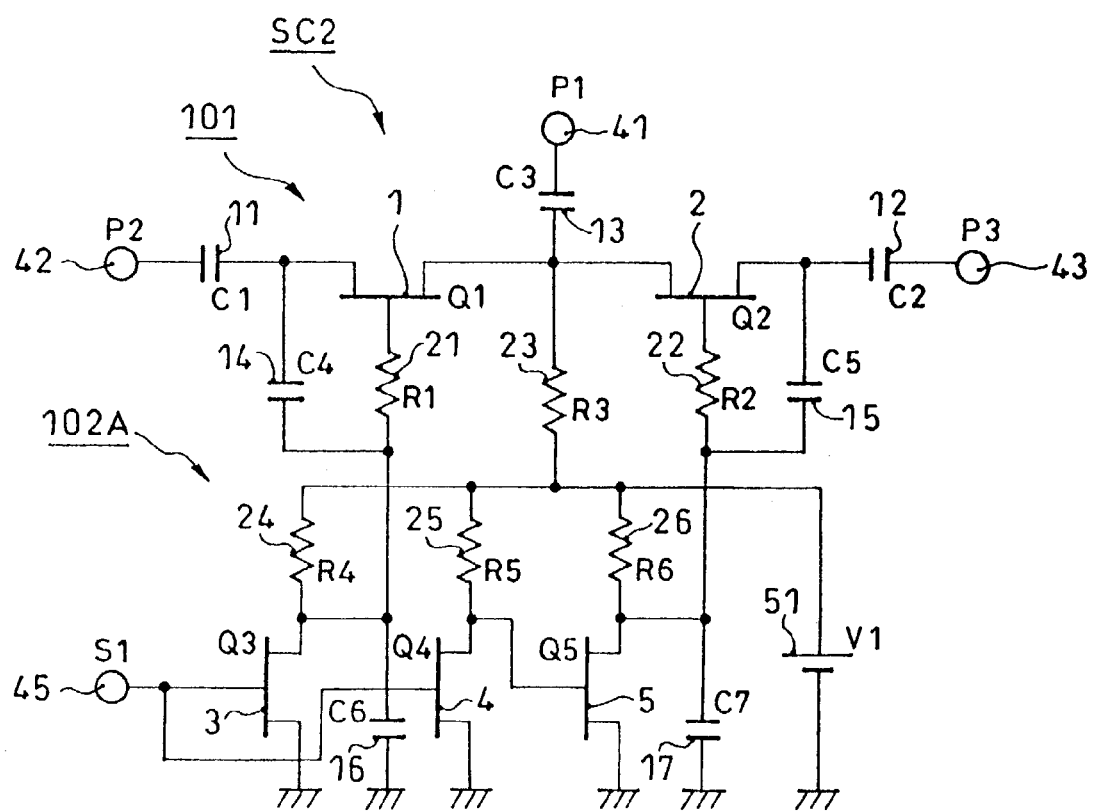
FIG. 2 is a circuit diagram illustrating a second exemplified circuit of a switch semiconductor integrated circuit according to an embodiment of the present invention.

Next, the second example will be described with reference to FIG. 2. Here, the same constituent elements as in the example shown in FIG. 1 will be denoted with the same reference symbols and the detailed explanation there of will be omitted. Hereafter, a description will be concentrated on the different points.

The switch semiconductor integrated circuit SC2 in this second example further includes sixth and seventh capacitors 16, 17 in the logic control section 102A, in addition to the arrangement shown in the first example.

Namely, the sixth capacitor 16 (represented as "C6" in FIG. 2) serving as an auxiliary capacitor is connected between the drain (or source) of the third FET 3 and the ground, whereas the seventh capacitor 17 (represented as "C7" in FIG. 2) serving as an auxiliary capacitor is connected between the drain (or source) of the fifth FET 5 and the ground.

According to such an arrangement, unnecessary high frequency signals generated on the switching signal line will be removed by the sixth and seventh capacitors 16, 17, and the magnitude of the high-frequency signal voltage component superposed onto the switching signal line can be set by suitably setting the capacitance ratios of the sixth and seventh capacitors 16, 17 to the fourth and fifth capacitors 14, 15 for coupling the high-frequency signal which is input into the switch semiconductor integrated circuit SC2.

In both of the above-described examples, those having an inverter circuit have been raised as examples; however, if the switching signal line connected to the gates of the switch FETs (i.e. those corresponding to the first and second switch FETs 1, 2 in the above-described examples) has a high impedance, the principle of the present invention can be applied and similar effects can be obtained even in the case of those without having an inverter circuit.

Figure 3:
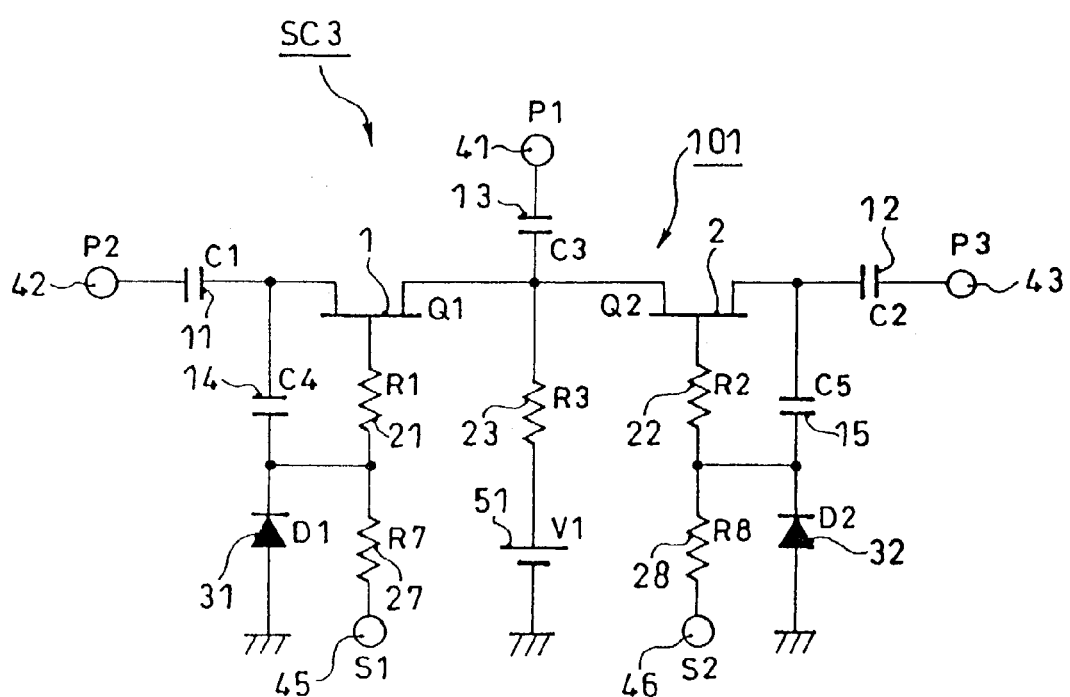
FIG. 3 is a circuit diagram illustrating a third exemplified circuit of a switch semiconductor integrated circuit according to an embodiment of the present invention.

Next, the third example will be described with reference to FIG. 3. Here, the same constituent elements as in the example shown in FIG. 1 will be denoted with the same reference symbols and the detailed explanation thereof will be omitted. Hereafter, description will be concentrated on the different points.

The switch semiconductor integrated circuit SC3 in this third example is an example without having a logic control section using an inverter circuit, in contrast to the first and second examples.

Namely, the third example basically has the same arrangement as the first example shown in FIG. 1 except that the circuit for supplying the switching signal to the gate of first and second switch FETs 1, 2 of switch section 101 is different from that in the example shown in FIG. 1.

Specifically, first, a seventh resistor 27 (represented as "R7" in FIG. 3) is connected between a first control signal input terminal 45 and the connection point which connects the first resistor 21 to the fourth capacitor C4, whereby the switching signal applied to the first control signal input terminal 45 from an outside logic circuit (not illustrated) is applied to the gate of the first switch FET 1 via the seventh resistor 27 and first resistor 21. Further, a first diode 31 (represented as "D1" in FIG. 3) is connected between the ground and the connection which that connects the first resistor 21 to the fourth capacitor 14 so that the anode of the first diode 31 is connected to the ground and the cathode thereof is connected to the connection point which connects the first resistor 21 to the fourth capacitor 14, respectively. Here, the seventh resistor 27 suitably has a resistance of about ten KΩ to several ten KΩ.

Meanwhile, an eighth resistor 28 (represented as "R8" in FIG. 3) is connected between a second control signal input terminal 46 and the connection point which connects the second resistor 22 to the fifth capacitor 15, whereby the switching signal applied to the second control signal input terminal 46 from the outside logic circuit is applied to the gate of the second switch FET 2 via the eighth resistor 28 and second resistor 22. Further, a second diode 32 (represented as "D2" in FIG. 3) is connected between the ground and the connection point which connects the second resistor 22 to the fifth capacitor 15 so that the anode of the second diode 32 is connected to the ground and the cathode thereof is connected to the connection point which connects the second resistor 22 to the fifth capacitor 15, respectively. Here, the eighth resistor 28 suitably has a resistance of about ten KΩ to several ten KΩ.

Further, one end of the third resistor 23 is connected to the connection point which connects the source (or drain) of the first switch FET 1 to the drain (or source) of the second switch FET 2 in the same manner as in the example of FIG. 1, and the other end is connected to a power source 51.

According to such an arrangement, opposite logic signals are applied respectively to the first control signal input terminal 45 and second control signal input terminal 46 from an outside logic circuit (not illustrated).

Namely, when, for example, the same voltage as the power source voltage Vdd supplied from the power source 51 is applied to the first control signal input terminal 45 with the second control signal input terminal 46 being set at the ground voltage, the voltage differences between the gate and drain and between the gate and source of the first switch FET 1 will be zero, so that the first switch FET 1 will be in the on-state, thereby enabling passage of a high-frequency signal between the drain and source. On the other hand, the second switch FET 2 will be in the off-state since the gate is at the ground voltage while the voltage difference between the drain and source of the second switch FET 2 is Vdd.

If a high-frequency signal is input from the first signal terminal 41 or second signal terminal 42 in this state, a part of the high-frequency signal leaks to the line (connection point) between the first resistor 21 and seventh resistor 27 by the fourth capacitor 14 for coupling. Because the seventh resistor 27 has a high resistance, the leaked part of the high-frequency signal and the DC voltage serving as a switching signal applied from outside via the first control signal input terminal 45 will be superposed onto each other; however, the part of the high-frequency signal in the period of negative value will be fixed at the built-in voltage −Vbi of the diode by the first diode 31. As a result, because of the principle similar to the one described with reference to the example of FIG. 1, when a large signal is applied to this switch semiconductor integrated circuit SC3, the switching voltage of the switch FET in the off-state (first or second switch FET 1, 2) can be raised, thereby enabling switching of a large signal at a low driving voltage.

In the embodiments of the present invention, a description has been provided of raising an SPDT (Single Pole Dual Throw) switch as an example; however, the present invention can be likewise applied to a general switch semiconductor integrated circuit having a switch FET in an on-state and a switch FET in an off-state in the switch circuit, such as a DPDT (Dual Pole Dual Throw) switch.

As described above, the present invention produces an effect that a high-frequency signal of a power greater than in conventional cases can be switched without raising the driving voltage by providing an arrangement in which a part of the input high-frequency signal can be rectified to be superposed onto the gate voltage of the switch FET in the on-state for passage of the high-frequency signal.

Further, because a high-frequency signal of a power greater than in the conventional cases can be switched, the present invention can advantageously provide a switch semiconductor integrated circuit with improved high-frequency characteristics and deformation characteristics.

What is claimed is:

1. A switch semiconductor integrated circuit having a switch FET for controlling passage of a high-frequency signal so that the switch FET is switched between on-operation and off-operation by a switching signal applied to a gate of the switch FET,
   wherein the switch semiconductor integrated circuit includes a logic control section using an inverter circuit which generates the switching signal in accordance with a control signal applied from outside,
   the inverter circuit uses a junction-type FET to which a resistance load connected to a power source is connected, and
   the gate of the switch FET is connected to an output end of the inverter circuit via a gate resistor, and the output end is connected to a coupling capacitor which couples a part of the high-frequency signal, the coupling capacitor being connected between one of the drain and source of the switch FET and the output end of the inverter circuit,
   wherein the gate resistor is connected between the gate of the switch FET and one end of the coupling capacitor,
   whereby the coupled high-frequency signal is rectified by an equivalent diode between the gate and drain of the junction-type FET, and is superposed onto a DC voltage applied to the gate of the switch FET.

2. A switch semiconductor integrated circuit having a switch FET for controlling passage of a high-frequency signal so that the switch FET is switched between on-operation and off-operation by a switching signal applied to a gate of the switch FET,
   wherein the switch semiconductor integrated circuit includes a logic control section using an inverter circuit which generates the switching signal in accordance with a control signal applied from outside,
   the inverter circuit uses a junction-type FET to which a resistance load connected to a power source is connected, and
   the gate of the switch FET is connected to an output end of the inverter circuit via a gate resistor, and the output end is connected to a coupling capacitor which couples a part of the high-frequency signal, the coupling capacitor being connected between one of the drain and source of the switch FET and the output end of the inverter circuit,
   wherein an auxiliary capacitor is provided between the output end and the drain of the inverter circuit for enabling adjustment of magnitude of rectified voltage of the high-frequency signal to be superposed onto the DC voltage on the basis of capacitance ratios of the auxiliary capacitor and the coupling capacitor.

3. A switch semiconductor integrated circuit having a switch FET for controlling passage of a high-frequency signal so that the switch FET is switched between on-operation and off-operation by a switching signal applied to a gate of the switch FET,
   wherein two resistors are connected in series between a signal terminal to which the switching signal is applied and a gate of the switch FET,
   a coupling capacitor for coupling a part of the high-frequency signal is connected from one of a drain and a source of the switch FET to a connection point of the two resistors, while a diode is connected between the connection point and a ground so that a cathode of the diode is connected to the connection point and an anode of the diode is connected to the ground respectively,
   wherein the coupled high-frequency signal is rectified by the diode and is superposed onto a DC voltage applied to the gate of the switch FET.

* * * * *